United States Patent
Gao (10) Patent No.: US 11,805,622 B2
(45) Date of Patent: Oct. 31, 2023

(54) TWO PHASE IMMERSION COOLING SYSTEM WITH DUAL CONDENSER UNITS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 40 days.

(21) Appl. No.: 17/357,037

(22) Filed: Jun. 24, 2021

(65) Prior Publication Data

US 2022/0418161 A1 Dec. 29, 2022

(51) Int. Cl.
  *H05K 7/20* (2006.01)

(52) U.S. Cl.
  CPC ......... *H05K 7/20318* (2013.01); *H05K 7/203* (2013.01); *H05K 7/20327* (2013.01); *H05K 7/20381* (2013.01); *H05K 7/20827* (2013.01)

(58) Field of Classification Search
  CPC .... H05K 7/20318; H05K 7/203; H05K 7/327; H05K 7/20827; H05K 7/20809; H05K 7/20818; H05K 7/20236; H05K 7/20327; H05K 7/20381; H05K 7/20836; H05K 7/2079; H05K 7/208; H05K 7/20272; H05K 7/20281; H05K 7/20654; H05K 7/2029; F28D 15/0266; G06F 1/20; G06F 2200/201; G06F 1/206
  USPC .......... 361/700, 699, 679.53, 704, 689, 688; 165/104.33, 80.4, 104.21, 80.2; 257/714, 257/715; 62/434
  See application file for complete search history.

(56) References Cited

U.S. PATENT DOCUMENTS

| 10,206,307 | B2* | 2/2019 | Lau | H05K 7/20318 |
|---|---|---|---|---|
| 2014/0218861 | A1* | 8/2014 | Shelnutt | H05K 7/20818 |
| | | | | 361/679.53 |
| 2014/0366566 | A1* | 12/2014 | Wei | H05K 7/2079 |
| | | | | 62/259.2 |
| 2017/0325355 | A1* | 11/2017 | Lau | H05K 7/20318 |
| 2019/0078846 | A1* | 3/2019 | Wan | F28F 9/262 |
| 2021/0059079 | A1* | 2/2021 | Keehn | H05K 7/20327 |
| 2021/0153392 | A1* | 5/2021 | Gao | H05K 7/20818 |
| 2021/0410320 | A1* | 12/2021 | Yang | H05K 7/20818 |
| 2022/0110223 | A1* | 4/2022 | Heydari | H05K 7/20509 |
| 2022/0225527 | A1* | 7/2022 | Chen | H05K 7/203 |
| 2022/0225528 | A1* | 7/2022 | Chen | H05K 7/203 |

* cited by examiner

*Primary Examiner* — Mandeep S Buttar
(74) *Attorney, Agent, or Firm* — WOMBLE BOND DICKINSON (US) LLP (57) ABSTRACT

An immersion cooling system includes an immersion tank and one or more information technology (IT) equipment situated within the immersion tank. The IT equipment is configured to provide IT services and is at least partially submerged within a phase change liquid, where, when the IT equipment provides the IT services, the IT equipment generates heat that is transferred to the phase change liquid thereby causing at least some of the phase change liquid to turn into vapor phase. The immersion cooling system includes a primary condenser unit positioned above the immersion tank and a secondary condenser unit, where, either a single, or both the primary and secondary condenser units are configured to receive cooling liquid from an external cooling unit to condense the phase change liquid in vapor phase back into liquid phase.

14 Claims, 7 Drawing Sheets

TWO PHASE IMMERSION COOLING SYSTEM WITH DUAL CONDENSER UNITS

FIELD OF THE INVENTION

Embodiments of the present invention relate generally to servers and data center cooling. More particularly, embodiments of the invention relate to a two phase immersion cooling system with dual condenser units.

BACKGROUND

Thermal management for a data center that includes several active electronic racks is critical to ensure proper performance of servers and/or other IT equipment (e.g., performing IT services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use of cooling air to cool the IT equipment. The cooling air is recirculated through cooling units. Heat generated by the IT equipment is captured by the cooling air and is extracted by the cooling unit.

Recently, data centers have been deploying more high-power density electronic racks, where more high-density chips are packaged closer together to provide more computing power and low communication overhead. Cooling these high-density racks by maintaining a proper thermal environment may be an issue with existing cooling systems, such as any air cooling based system.

Immersion cooling, on the other hand, which involves at least partially submerging electronics in a dielectric solution is a feasible solution for high-density electronics. Implementing immersion cooling in existing data centers, however, has challenges. Existing solutions for immersion cooling have a single condenser unit. Such solutions may not satisfy the high reliability and redundancy requirements for high power density computing systems.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Aspects of the present disclosure relates to immersion cooling solutions that include dual condenser units, where a primary condenser unit is implemented at the immersion tank and a secondary condenser unit can be situated adjacent to or on top of the immersion tank. A vapor loop and liquid loop for the first condenser at the immersion system can be connected to a vapor and liquid line of the secondary condenser unit. The vapor is either condensed at the immersion system or is to rise to the secondary condenser unit to be condensed at the secondary condenser unit. An external cooling loop can be connected to the first condenser and the second condenser directly to feed a cooling liquid from an external cooling unit. Three valves can be used at the external loop to set the dual condenser units to operate in different operating modes for different cooling capacities, such that the dual condenser units can provide a redundancy in design, high reliability, and is configurable for different cooling performance.

According to a first aspect, an immersion cooling system includes an immersion tank and one or more information technology (IT) equipment situated within the immersion tank. The IT equipment is configured to provide IT services and is at least partially submerged within a phase change liquid, where, when the IT equipment provides the IT services, the IT equipment generates heat that is transferred to the phase change liquid thereby causing at least some of the phase change liquid to turn into vapor phase. The immersion cooling system includes a primary condenser unit positioned on top of the immersion fluid within the immersion tank and is configured to receive cooling liquid from an external cooling unit to condense the phase change liquid in vapor phase back into liquid phase. The immersion cooling system includes a secondary condenser unit coupled to the immersion tank via a vapor line and a liquid line, where the secondary condenser unit is configured to receive cooling liquid from the external cooling unit to condense vapor at the vapor line to phase change liquid in liquid phase, where the primary condenser unit and the secondary condenser unit are configured to operate in parallel, series, or single condenser modes, where the primary condenser is within the immersion tank.

In one embodiment, the immersion cooling system further includes a first liquid line and a second liquid line between the primary condenser unit and the secondary condenser unit, where the first liquid line and the second liquid line form a liquid loop to circulate a cooling liquid between the primary condenser unit and the secondary condenser unit. In one embodiment, the immersion cooling system further includes a first valve coupling a feed line of the external cooling unit to the first liquid line and bisecting the first liquid line, where the first valve is a three way valve, a second valve coupling the bisected first liquid line near the secondary condenser unit to a release line of the external cooling unit, a third valve coupling the second liquid line to the release line of the external cooling unit, and a pump at the release line of the external cooling unit.

In one embodiment, the first valve is set to open from the external cooling unit to the primary condenser unit and is set to close from the external cooling unit to the secondary condenser unit, the second valve is set to open, and the third valve is set to close to operate the primary and secondary condenser units in a series mode. In one embodiment, the first valve is set to open from the external cooling unit to the primary condenser unit and from the external cooling unit to the secondary condenser unit, the second valve is set to close, and the third valve is set to open to operate the primary and secondary condenser units in a parallel mode.

In one embodiment, the first valve is set to close from the external cooling unit to the primary condenser unit and is set to open from the external cooling unit to the secondary condenser unit, the second valve is set to close, and the third valve is set to open to operate the secondary condenser units in a single condenser mode. In one embodiment, the first valve is set to open from the external cooling unit to the primary condenser unit and is set to close from the external cooling unit to the secondary condenser unit, the second valve is set to close, and the third valve is set to open to operate the primary condenser units in a single condenser mode.

In one embodiment, the immersion cooling system further includes a temperature sensor positioned at the feedline of an external cooling unit and configured to sense temperature information of liquid feed by the external cooling unit, a power sensor at the immersion tank configured to sense power consumption information for the one or more IT equipment, and a controller electrically coupled to the temperature sensor and the power sensor, the controller includes a cooling optimizer to determine an operating mode for the primary condenser unit and the second condenser unit based on the temperature and power consumption information.

According to a second aspect, a system receives thermal load and temperature information from a cooling system with a primary condenser unit and a secondary condenser unit. The system determines a first operating mode for the cooling system based on the power consumption and temperature information, where the first operating mode of the primary and secondary condenser units is one of parallel, series, or single condenser modes, where the first operating mode is determined using a cooling optimizer. The system configures the cooling system to operate at the first operating mode.

In one embodiment, the system sets operating statuses of a plurality of valves that are configured to operate the primary and secondary condenser units in one of parallel, series, or single condenser modes. In one embodiment, the temperature and power information comprises time series temperature data and/or time series power data. In one embodiment, the cooling optimizer comprises a machine learning neural network optimizer. In one embodiment, the system sets the operating status of a plurality of valves that manages the cooling fluid distributed to the two condensers when they operating in a parallel mode.

In one embodiment, the primary and secondary condenser units provide cooling for an immersion cooling system. In one embodiment, in response to receiving additional power consumption information, the system determines a second operating mode for the cooling system based on the additional power consumption information, and the system configures the cooling system to operate from the first operating mode to the second operating mode.

According to a third aspect, a data center includes an external cooling unit and an immersion cooling system coupled to the external cooling unit. The immersion cooling system includes an immersion tank and one or more information technology (IT) equipment situated within the immersion tank. The IT equipment is configured to provide IT services and is at least partially submerged within a phase change liquid, where, when the IT equipment provides the IT services, the IT equipment generates heat that is transferred to the phase change liquid thereby causing at least some of the phase change liquid to turn into vapor phase. The immersion cooling system includes a primary condenser unit positioned above the immersion tank and is configured to receive cooling liquid from the external cooling unit to condense the phase change liquid in vapor phase back into liquid phase. The immersion cooling system includes a secondary condenser unit coupled to the immersion tank via a vapor line and a liquid line, where the secondary condenser unit is configured to receive cooling liquid from the external cooling unit to condense vapor to change phase to liquid, where the primary condenser unit and the secondary condenser unit are configured to operate in parallel, series, or single condenser modes.

Figure 1:
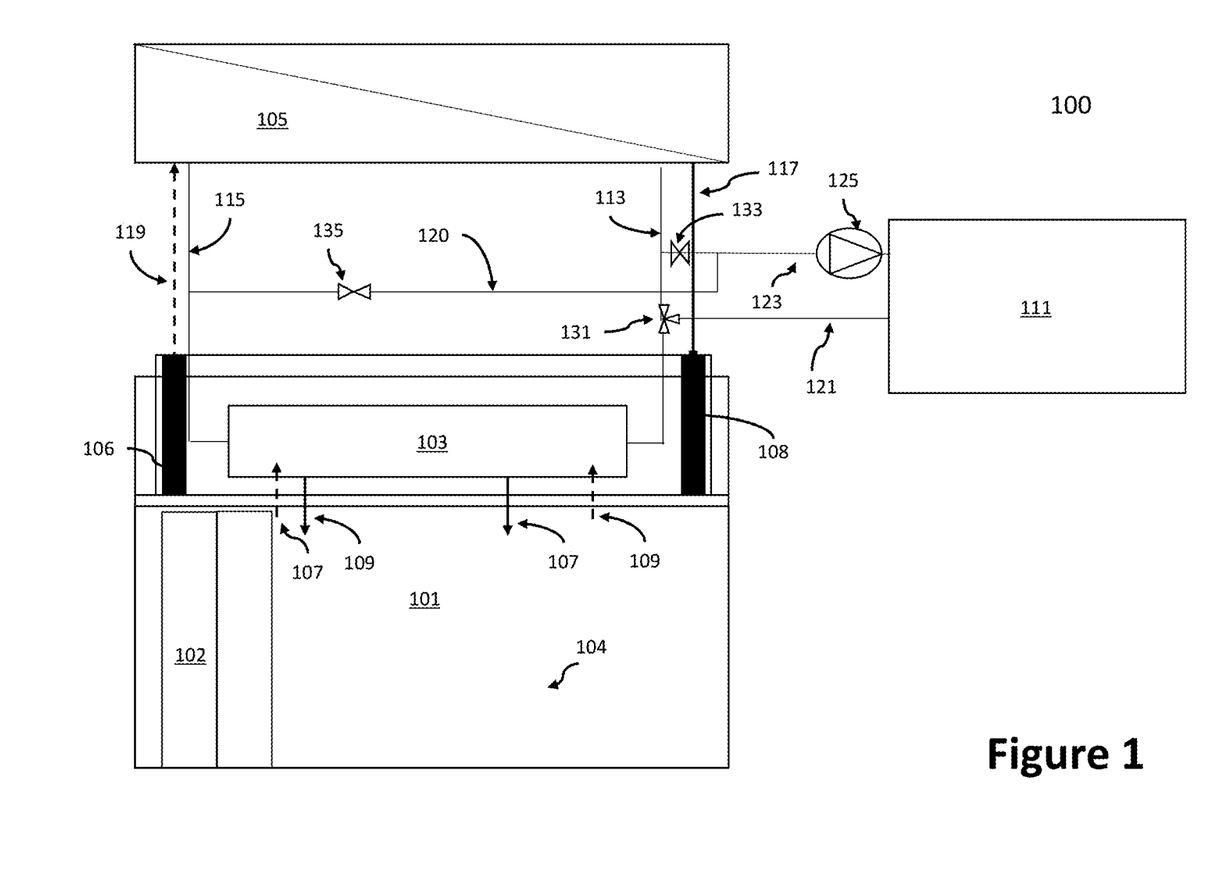
FIG. 1 is a block diagram illustrating an immersion cooling system according to one embodiment.

FIG. 1 is a block diagram illustrating an immersion cooling system 100 according to one embodiment. Specifically, this figure shows an immersion cooling system 100 (hereafter referred as cooling system) that is configured to immersion cool one or more pieces of information technology (IT) equipment 102. Cooling system 100 can be a cooling system as part of a data center. In one embodiment, cooling system 100 includes immersion tank 101, a primary condenser unit 103, and a secondary condenser unit 105 for dual condenser units. Immersion tank 101 can contain a phase change liquid/fluid that is used to cool immersion tank 101. Immersion tank 101 can include IT equipment 102 located within immersion tank 101.

IT equipment 102 can be configured to provide IT services. Specifically, IT equipment 102 may include a host server (referred to as a host node) and/or one or more compute servers (also referred to as computing nodes, such as CPU server and GPU server). The host server (having one or more CPUs) typically interfaces with clients (not shown in FIG. 1) over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. In one embodiment, IT equipment 102 may perform any type of computing task and/or may be any type of computing device (e.g., a server, a storage device, etc.). In one embodiment, IT equipment 102 may be edge computing devices. Thus, while IT equipment 102 provide the IT services, the equipment generates heat that is transferred into phase change fluid 104.

Referring to FIG. 1, primary condenser unit 103 can include condensing coils which are located within immersion tank 101. Vapor within immersion tank 101 can rise to condensing coils of primary condenser unit 103 which is then condensed back into liquid phase within immersion tank 101. Immersion tank 101 can include vapor loop 109 and liquid loop 107 contained within immersion tank 101, vapor loop 109 and liquid loop 107 can circulate the phase change liquid between immersion tank 101 and primary condenser unit 103, in vapor and liquid phases.

In one embodiment, vapor loop 109 and liquid loop 107 are connected and extended to vapor line 119 and liquid line 117, respectively. In one embodiment, immersion tank 101 includes vapor port 106 and liquid port 108, where vapor port 106 and liquid port 108 are coupled to vapor line 119 and liquid line 117 respectively to connect immersion tank to secondary condenser 105. In one embodiment, the two ports are assembled with dry quick disconnect couplings. Dry Disconnect Couplings are designed for quick and spill free connection and disconnection of hoses and pipelines. Vapor line 119 and liquid line 117 can be connected to secondary condenser unit 105 to direct phase change liquid in vapor phase to secondary condenser unit 105 and phase change liquid in liquid phase from secondary condenser unit 105 back to immersion tank 101. For example, vapor can rise via vapor line 119 to condensing coils of secondary condenser unit 105, where the vapor can be condensed into liquid phase. The condensed liquid can then return back to immersion tank 101 via liquid line 117 by gravity.

In one embodiment, cooling system 100 includes external cooling unit 111 to provide cooling liquid to condenser units 103 and 105. As shown, cooling system 100 can include a number of cooling liquid lines connected among primary condenser unit 103, secondary condenser unit 105, and external cooling unit 111. In one embodiment, cooling liquid is different from phase change liquid. In one embodiment, cooling liquid is water.

In one embodiment, cooling system 100 includes first liquid line 113 and second liquid line 115 forming a loop to circulate cooling liquid between condenser units 103 and 105. In one embodiment, cooling system 100 includes feed line 121 between external cooling unit 111 and first liquid line 113, bisecting first liquid line 113 (e.g., dividing liquid line 113 into two parts).

In one embodiment, there can be three valves used for controlling the cooling fluid distribution and operation of primary and second condenser units 103, 105. In one embodiment, cooling system 100 includes a first (three way) valve 131 coupled between feed line 121 and first liquid line 113, bisecting first liquid line 113, where feed line 121 is coupled to a feed port of external cooling unit 111.

In one embodiment, cooling system 100 includes a second (two way) valve 133 couple between a return line 123 and a section of first liquid line 113 that is near secondary condenser unit 105, where return line 123 is coupled to a return port of external cooling unit 111.

In one embodiment, cooling system 100 includes a third (two way) valve 135 at line 120 which is coupled between second liquid line 115 and return line 123. In one embodiment, cooling system 100 includes pump 125 at return line 123 to facilitate a fluid flow at return line 123. Note that valves 131-135 can have ports that can be switched open and close to operate the primary and secondary condenser units in series, parallel, and in single condenser operating modes as further illustrated in FIGS. 3-6.

In the overall system, the redundancy and high reliability of the dual condenser units 103, 105 are operable in different operating modes as needed for different power consumption loads or thermal management requirements.

Figure 2:
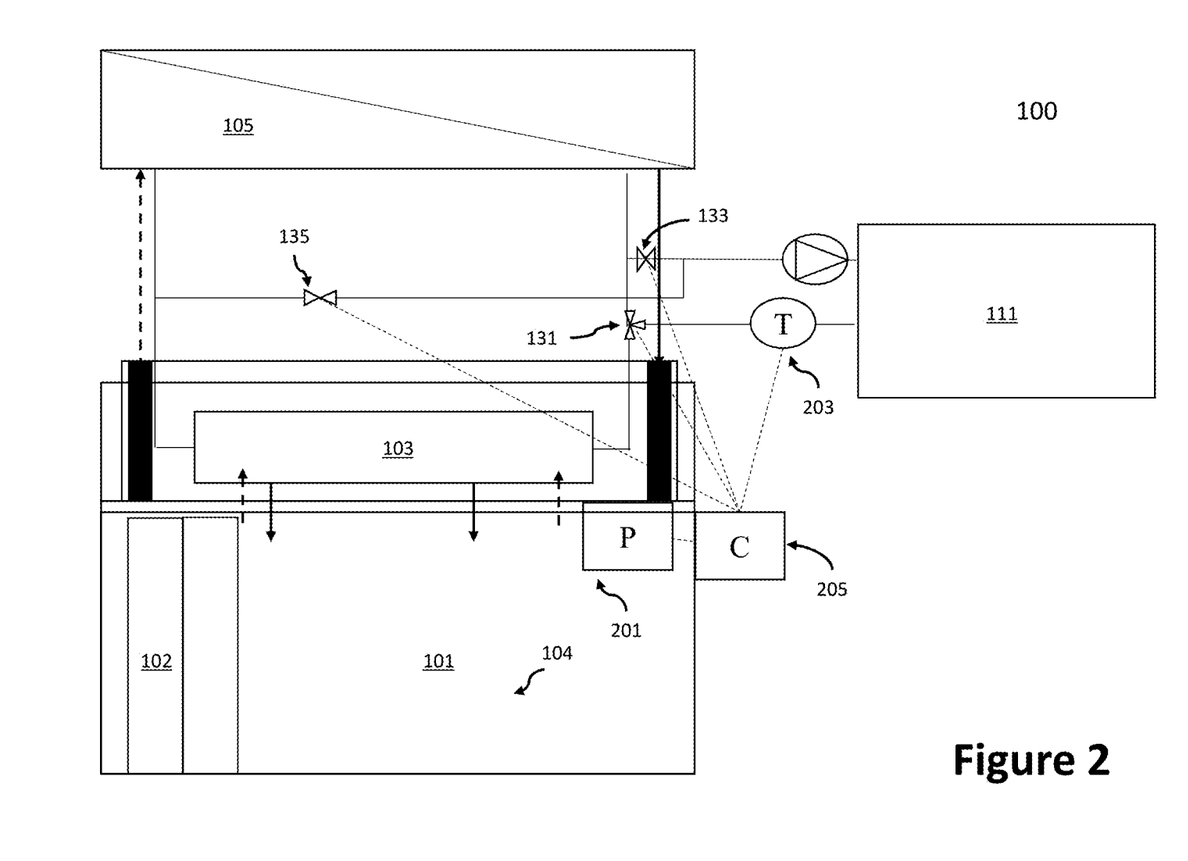
FIG. 2 is a block diagram illustrating a control system for an immersion cooling system according to one embodiment.

FIG. 2 is a block diagram illustrating a control system for immersion cooling system 100 according to one embodiment. The control system includes a power sensor 201, a temperature sensor 203, and a controller 205. Power sensor 201 can measure a power/electric information for IT equipment 102 within immersion tank 101. Temperature sensor 203 can measure a temperature for cooling liquid provided from external cooling unit 111 to primary and secondary condenser units 103, 105. Controller 205 can control an operating state for valves 131-135. In one embodiment, controller 205 can be integrated with an immersion tank management control which manages and controls the amount of phase change liquid 104 contained at immersion tank 101.

In one embodiment, controller 205 can be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, controller 205 may be a circuit with a combination of analog elements (e.g., resistors, capacitors, inductors, etc.) and/or digital elements (e.g., logic-based elements, such as transistors, etc.). Controller 205 may also include memory. In one embodiment, controller 205 may be a part (or integrated) of immersion tank 101. In another embodiment, controller 205 may be one of IT equipment 102 that is at least partially submerged within phase change liquid 104.

In one embodiment, controller 205 is communicatively coupled (e.g., wired and/or wirelessly connected) to valves 131-135, power sensor 201, and temperature sensor 203. Specifically, controller 205 is configured to receive power consumption and/or temperature information (as electrical signals) from sensors 201-203 in real-time and to control valves 131-135 (e.g., by transmitting a control signal to control circuitry of the valves, such as an electronic switch) in order to adjust an operating state of valves 131-135 (e.g., to at least partially open the valve, open the valve all the way, or close the valve). In one embodiment, controller 205 may control valves 131-135 based on real-time power consumption and/or temperature information.

In one embodiment, controller 205 can include a cooling optimizer that can determine an operating state for valves 131-135 to operate cooling system 100 in an optimized operating strategy, e.g., optimized cooling performance, optimized power efficiency, or a combination thereof, etc. In one embodiment, the cooling optimizer includes a machine learning model that is trainable to select an operating mode of cooling system 100. Examples of machine learning model include support vector machine, random forest, regression model, decision trees, etc.

In one embodiment, the machine learning model is a trainable deep learning neural network model that is trainable to select an operating mode (e.g., series, parallel, or single condenser) for cooling system 100 using power consumption and/or temperature information. Examples of deep learning neural network model include long short-term memory model, transformers, convolutional neural network model, multilayer perceptron, reinforcement learning model, imitation learning model, etc. Note that the power consumption and/or temperature information can include real-time or historical time series information collected from cooling system 100 over a predetermined period of time. The cooling optimizer can be trained using past and/or real-time power consumption and/or temperature information of cooling system 100, as well as design data.

Cooling system 100 can be configured to operating in at least four operating modes. The at least four operating modes are series, parallel, single secondary condenser, or single primary condenser modes, as further illustrated in FIGS. 3-6.

Figure 3:
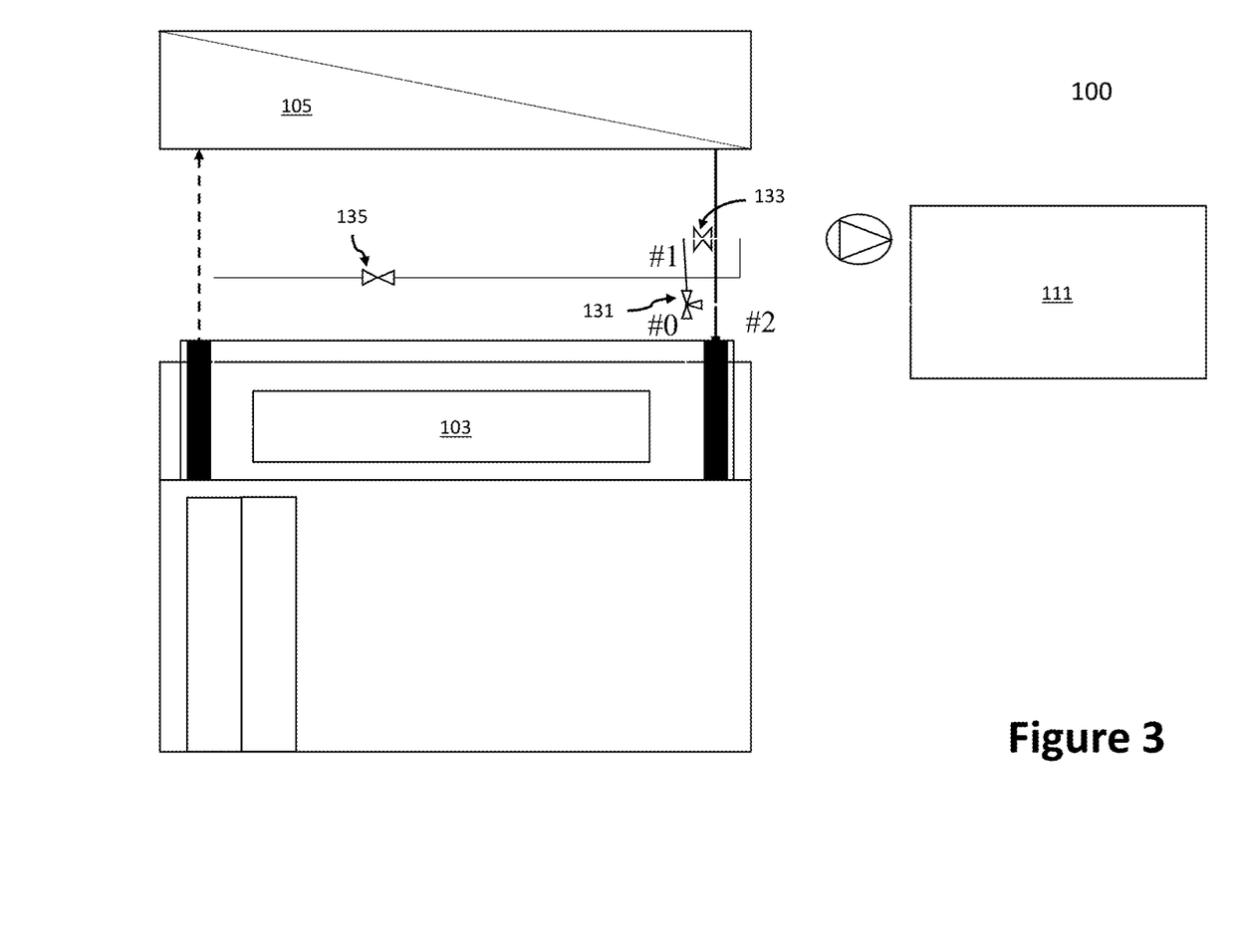
FIG. 3 is a block diagram illustrating a series operating mode for dual condenser units for an immersion cooling system according to one embodiment.

FIG. 3 is a block diagram illustrating a series operating mode for dual condenser units for an immersion cooling system according to one embodiment. In this series operating mode, valve 135 is closed, valve 133 is open, and valve 131 is set to open from ports #2 to #0 and closed from ports #2 to #1. An open valve/port allows liquid to flow through the valve/port. A closed valve/port stops a liquid from flowing through the valve/port. In this series operating mode, cooling fluid is delivered from external cooling unit 111 to primary condenser unit 103 and then secondary condenser unit 103.

Figure 4:
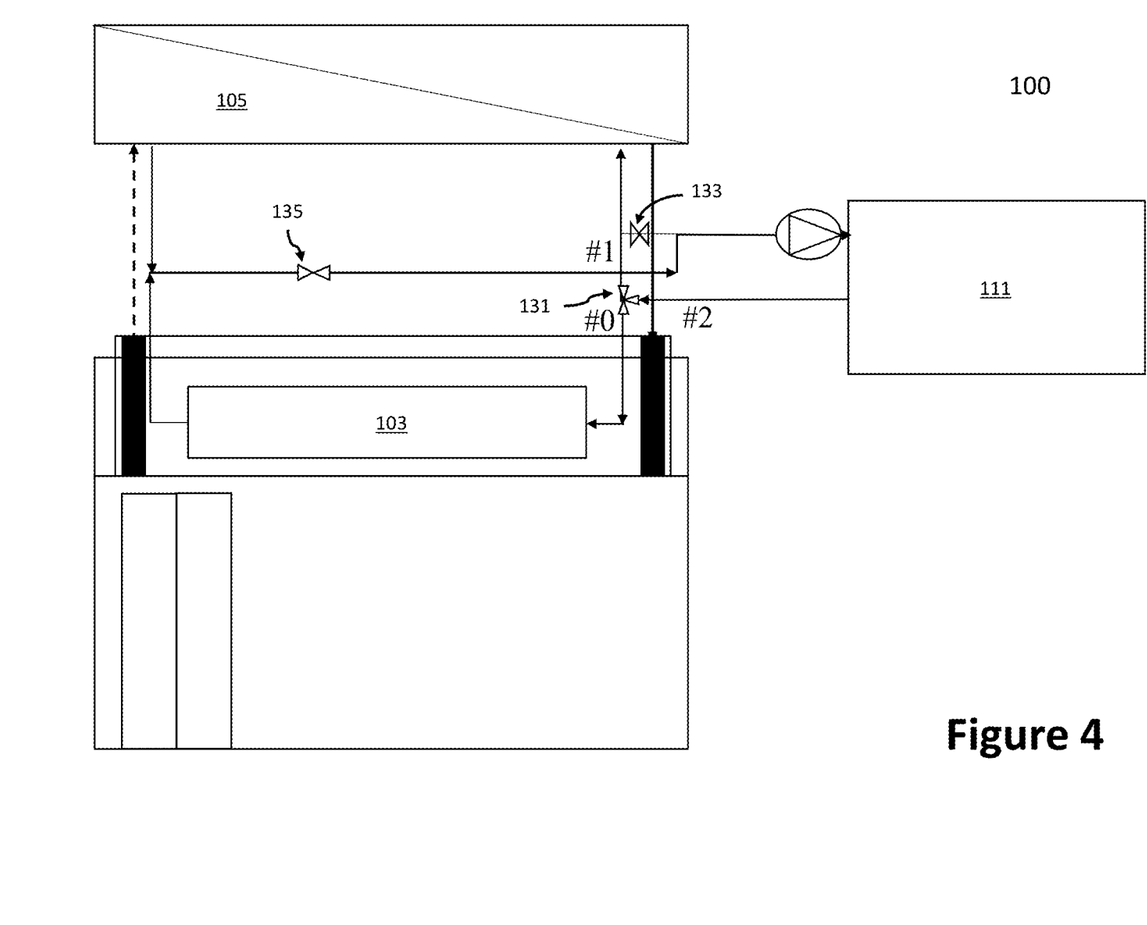
FIG. 4 is a block diagram illustrating a parallel operating mode for dual condenser units for an immersion cooling system according to one embodiment.

FIG. 4 is a block diagram illustrating a parallel operating mode for dual condenser units for an immersion cooling system according to one embodiment. In this parallel operating mode. In this mode. In this mode, valve 135 is open and valve 133 is closed. Valve 131 has both ports #2 to #0 and ports #2 to #1 open. In this parallel operating mode, cooling liquid are distributed from external cooling unit 111 to both primary and secondary condenser units 103, 105, in parallel.

Figure 5:
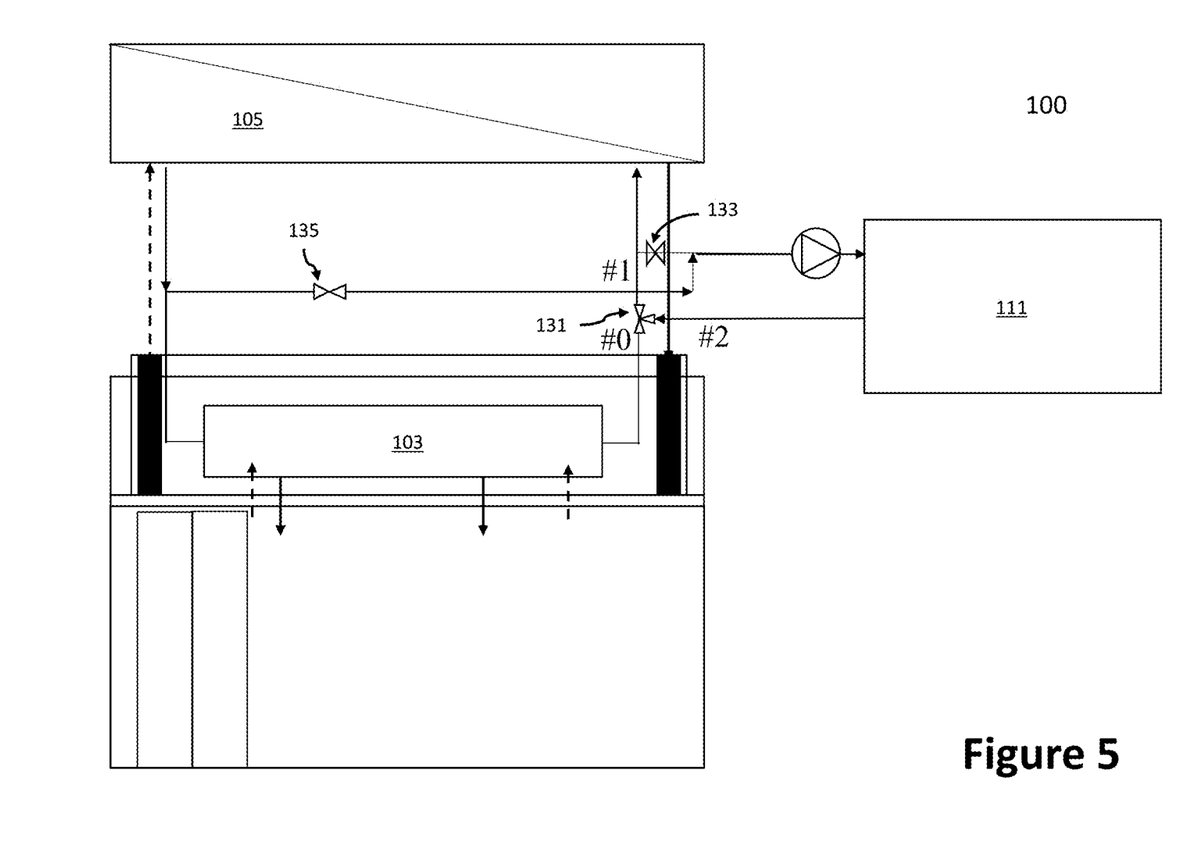
FIG. 5 is a block diagram illustrating a single secondary condenser operating mode for dual condenser units for an immersion cooling system according to one embodiment.

FIG. 5 is a block diagram illustrating a single secondary condenser operating mode for dual condenser units for an immersion cooling system according to one embodiment. In this single secondary condenser mode, valve 135 is open and valve 133 is closed. Valve 131 has ports #2 to #1 open and ports #2 to #0 closed. In this single secondary condenser mode, cooling liquid is distributed from external cooling unit 111 to only secondary condenser unit 105, and only secondary condenser 105 is used to cool immersion tank 101.

Figure 6:
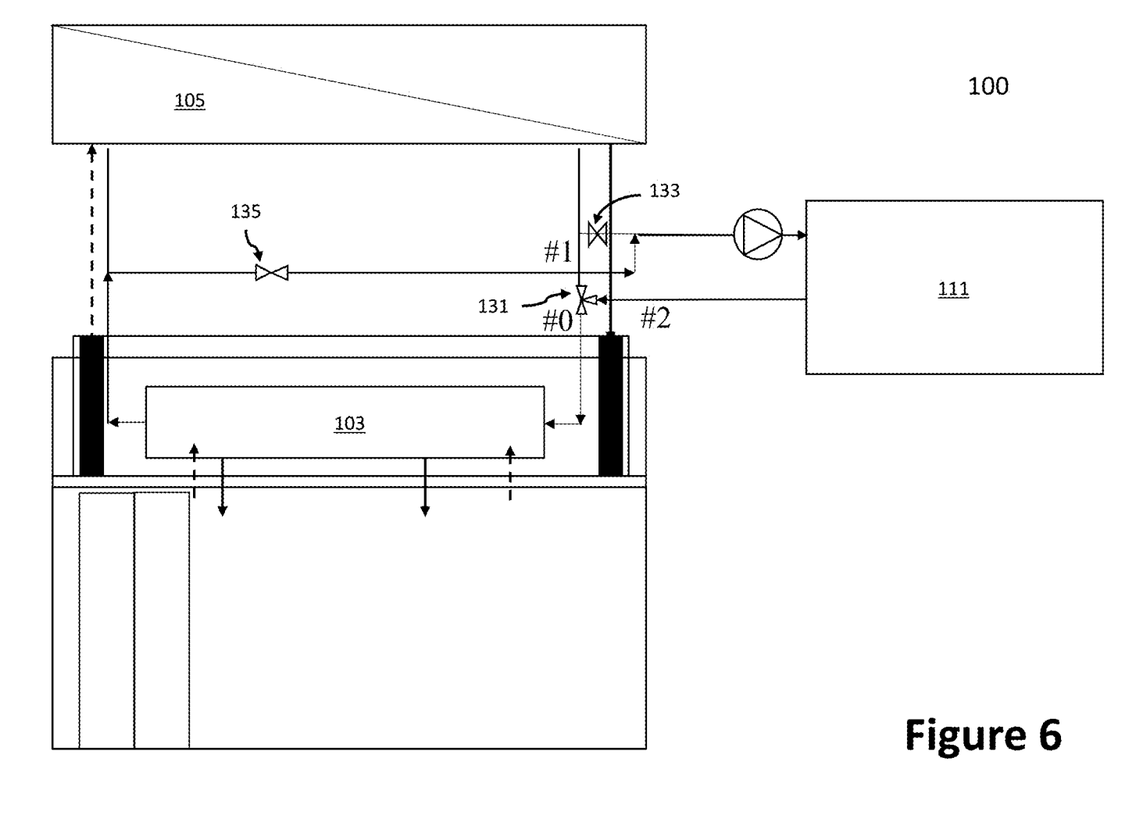
FIG. 6 is a block diagram illustrating a single primary condenser operating mode for dual condenser units for an immersion cooling system according to one embodiment.

FIG. 6 is a block diagram illustrating a single primary condenser operating mode for dual condenser units for an immersion cooling system according to one embodiment. In this single primary condenser mode, valve 135 is open, valve 133 is closed. Valve 131 has ports #2 to #0 open, and ports #2 to #1 close. In this single primary condenser mode, cooling liquid is distributed from external cooling unit 111 to only primary condenser unit 103 and only primary condenser unit 103 is used to cool immersion tank 101.

Figure 7:
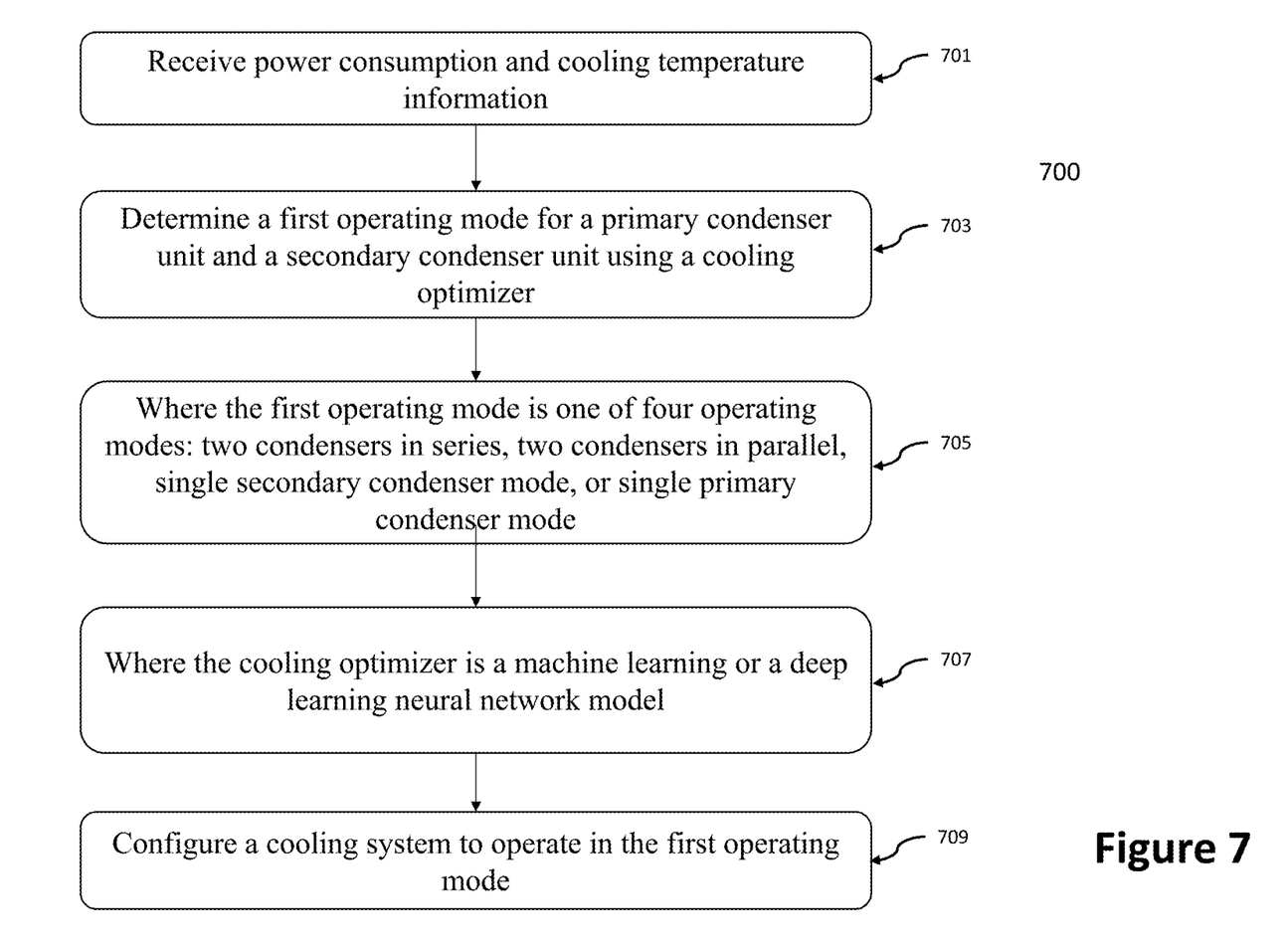
FIG. 7 is a flow diagram illustrating a method to operate an immersion cooling system according to one embodiment.

FIG. 7 is a flow diagram illustrating a method to operate an immersion cooling system according to one embodiment. illustrating a method to design an immersion cooling system according to one embodiment. Process 700 may be performed by processing logic which may include software, hardware, or a combination thereof. For example, process 700 may be performed by controller 205 of FIG. 2 to control cooling system 100.

At block 701, processing logic receives power consumption and temperature information from a cooling system 100 with a primary condenser unit 103 and a secondary condenser unit 105.

Primary condenser unit 103 can be contained within immersion tank 101 of cooling system 100. Secondary condenser unit 105 can be position on top of immersion tank and can be coupled to immersion tank 101 via a vapor line and a liquid line to circulate phase change liquid to secondary condenser unit 105.

Processing logic can retrieve power consumption information from a power sensor 201 that measure power/electric, computing load information of IT equipment 102 in immersion tank 101, where power/electric, computing load information can be converted to a thermal load output at immersion tank 101. Processing logic can retrieve temperature information from a temperature sensor 203 that measure a temperature of cooling liquid at feed line 121 that is coupled external cooling unit 111.

At block 703, processing logic determines a first operating mode for a primary condenser unit and a secondary condenser unit using a cooling optimizer.

At block 705, the first operating mode is one of four operating modes, two condensers in series, two condensers in parallel, single secondary condenser mode, or single primary condenser mode.

For example, processing logic can include an optimizer algorithm that is trained to selects the first operating mode for cooling system 100, where the first operating mode is one of four operating modes, two condensers in series, two condensers in parallel, single secondary condenser mode, or single primary condenser mode.

At block 707, the cooling optimizer is a machine learning or a deep learning neural network model. For example, the optimizer algorithm can include a trainable machine learning model or a deep learning neural network model.

At block 709, processing logic configures a cooling system to operate in the first operating mode. For example, processing logic sets the operating states for valves 131-135 corresponding to the first operating modes, to operating cooling system 100 in the first operating mode.

In one embodiment, while receiving real-time power consumption/temperature information, processing logic determines a second operating mode should be selected for the cooling system based on the real-time power consumption/temperature information using a cooling optimizer, and processing logic configures the cooling system to operate from the first operating mode to the second operating mode.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An immersion cooling system, comprising:
  an immersion tank to contain one or more information technology (IT) equipment at least partially submerged within a phase change liquid within the immersion tank, wherein the IT equipment is configured to provide IT services, wherein, when the IT equipment operates, the IT equipment generates heat that is transferred to the phase change liquid thereby causing at least some of the phase change liquid to turn into vapor phase;
  a primary condenser unit positioned above the immersion tank and is configured to receive cooling liquid from an external cooling unit to condense the phase change liquid in a vapor phase back into a liquid phase;
  a secondary condenser unit coupled to the immersion tank via a vapor line and a liquid line, wherein the secondary condenser unit is configured to receive cooling liquid from the external cooling unit to condense vapor at the vapor line to phase change liquid in liquid phase, wherein the primary condenser unit and the secondary condenser unit are configurable to operate in one of a parallel, a series, and a single condenser mode;
  a first valve coupling a feed line of the external cooling unit to a first liquid line and bisecting the first liquid line, wherein the first valve is a three way valve;
  a second valve coupling the bisected first liquid line near the secondary condenser unit to a release line of the external cooling unit;
  a third valve coupling a second liquid line to the release line of the external cooling unit; and
  a pump at the release line of the external cooling unit.

2. The immersion cooling system of claim 1, further comprising:
a first liquid line; and
a second liquid line between the primary condenser unit and the secondary condenser unit, wherein the first liquid line and the second liquid line form a liquid loop to circulate the cooling liquid between the primary condenser unit and the secondary condenser unit.

3. The immersion cooling system of claim 1, wherein the first valve is set to open from the external cooling unit to the primary condenser unit and is set to close from the external cooling unit to the secondary condenser unit, the second valve is set to open, and the third valve is set to close to operate the primary and secondary condenser units in a series mode.

4. The immersion cooling system of claim 1, wherein the first valve is set to open from the external cooling unit to the primary condenser unit and from the external cooling unit to the secondary condenser unit, the second valve is set to close, and the third valve is set to open to operate the primary and secondary condenser units in a parallel mode.

5. The immersion cooling system of claim 1, wherein the first valve is set to close from the external cooling unit to the primary condenser unit and is set to open from the external cooling unit to the secondary condenser unit, the second valve is set to close, and the third valve is set to open to operate the secondary condenser unit in a single condenser mode.

6. The immersion cooling system of claim 1, wherein the first valve is set to open from the external cooling unit to the primary condenser unit and is set to close from the external cooling unit to the secondary condenser unit, the second valve is set to close, and the third valve is set to open to operate the primary condenser unit in a single condenser mode.

7. The immersion cooling system of claim 1, further comprising:
a temperature sensor positioned at a feedline of an external cooling unit and configured to sense temperature information of liquid feed by the external cooling unit;
a power sensor at the immersion tank configured to sense power consumption information for the one or more IT equipment; and
a controller electrically coupled to the temperature sensor and the power sensor, the controller comprises a cooling optimizer to determine an operating mode for the primary condenser unit and the secondary condenser unit based on the temperature and power consumption information.

8. A data center, comprising:
an external cooling unit; and
an immersion cooling system coupled to the external cooling unit, the immersion cooling system comprising:
an immersion tank to contain one or more information technology (IT) equipment at least partially submerged within a phase change liquid within the immersion tank, wherein the IT equipment is configured to provide IT services, wherein, when the IT equipment operates, the IT equipment generates heat that is transferred to the phase change liquid thereby causing at least some of the phase change liquid to turn into vapor phase;
a primary condenser unit positioned above the immersion tank and is configured to receive cooling liquid from the external cooling unit and condense the phase change liquid in vapor phase back into liquid phase;
a secondary condenser unit coupled to the immersion tank via a vapor line and a liquid line, wherein the secondary condenser unit is configured to receive cooling liquid from the external cooling unit-vapor, wherein the secondary condenser unit condenses phase change liquid from vapor phase to liquid phase, wherein the primary condenser unit and the secondary condenser unit are configurable to operate in one of a parallel, a series, and a single condenser mode;
a first valve coupling a feed line of the external cooling unit to a first liquid line and bisecting the first liquid line, wherein the first valve is a three way valve;
a second valve coupling the bisected first liquid line near the secondary condenser unit to a release line of the external cooling unit;
a third valve coupling a second liquid line to the release line of the external cooling unit; and
a pump at the release line of the external cooling unit.

9. The data center of claim 8, wherein the immersion cooling system further comprises:
a first liquid line; and
a second liquid line between the primary condenser unit and the secondary condenser unit, wherein the first liquid line and the second liquid line form a liquid loop to circulate the cooling liquid between the primary condenser unit and the secondary condenser unit.

10. The data center of claim 8, wherein the first valve is set to open from the external cooling unit to the primary condenser unit and is set to close from the external cooling unit to the secondary condenser unit, the second valve is set to open, and the third valve is set to close to operate the primary and secondary condenser units in a series mode.

11. The data center of claim 8, wherein the first valve is set to open from the external cooling unit to the primary condenser unit and from the external cooling unit to the secondary condenser unit, the second valve is set to close, and the third valve is set to open to operate the primary and secondary condenser units in a parallel mode.

12. The data center of claim 8, wherein the first valve is set to close from the external cooling unit to the primary condenser unit and is set to open from the external cooling unit to the secondary condenser unit, the second valve is set to close, and the third valve is set to open to operate the secondary condenser unit in a single condenser mode.

13. The data center of claim 8, wherein the first valve is set to open from the external cooling unit to the primary condenser unit and is set to close from the external cooling unit to the secondary condenser unit, the second valve is set to close, and the third valve is set to open to operate the primary condenser unit in a single condenser mode.

14. The data center of claim 8, further comprising:
a temperature sensor positioned at a feedline of an external cooling unit and configured to sense temperature information of liquid feed by the external cooling unit;
a power sensor at the immersion tank configured to sense power consumption information for the one or more IT equipment; and a controller electrically coupled to the temperature sensor and the power sensor, the controller comprises a cooling optimizer to determine an operating mode for the primary condenser unit and the secondary condenser unit based on the temperature and power consumption information.

\* \* \* \* \*